United States Patent [19]

Huang et al.

[11] Patent Number: 5,354,700
[45] Date of Patent: Oct. 11, 1994

[54] METHOD OF MANUFACTURING SUPER CHANNEL TFT STRUCTURE

[75] Inventors: Heng-Sheng Huang, Taipei; Chun Y. Chang, Hsin Chu, both of Taiwan

[73] Assignee: United Microelectronics Corporation, Hsinchu, Taiwan

[21] Appl. No.: 96,904

[22] Filed: Jul. 26, 1993

[51] Int. Cl.$^5$ ............................................. H01L 21/265
[52] U.S. Cl. ............................................. 437/40; 437/84; 437/21; 437/106; 437/131; 148/DIG. 150; 148/DIG. 160
[58] Field of Search .................... 437/40, 41, 131, 132, 437/103, 106, 84, 21, 22; 148/DIG. 150, DIG. 59, DIG. 72

[56] References Cited

U.S. PATENT DOCUMENTS

| | | | |
|---|---|---|---|
| 4,312,680 | 1/1982 | Hsu | 437/21 |
| 4,994,866 | 2/1991 | Awano . | |
| 5,026,656 | 6/1991 | Matloubian et al. | 437/45 |
| 5,089,428 | 2/1992 | Verret et al. | 437/31 |
| 5,185,280 | 2/1993 | Houston et al. | 437/44 |
| 5,250,452 | 10/1993 | Ozturk et al. | 148/DIG. 59 |
| 5,256,550 | 10/1993 | Laderman et al. | 437/131 |

FOREIGN PATENT DOCUMENTS 0582558  4/1993  Japan .......................... 437/84

OTHER PUBLICATIONS

S. M. Sze, "Physics of Semiconductor Devices", pp. 568–570, 1969.

*Primary Examiner*—Tom Thomas
*Assistant Examiner*—Michael Trinh
*Attorney, Agent, or Firm*—George O. Saile; Graham S. Jones, II

[57] ABSTRACT

An FET thin film transistor is formed with a channel formed of a $Si/Si_{1-x}Ge_x/Si$ three layer sandwich which serves as the carrier transfer channel. The percentage of germanium is preferably less than 30% and should be less than about 50%. The TFT can be structured as top gate, bottom gate or twin gate structure. The $Si/Si_{1-x}Ge/Si$ sandwich layer is processed in a continuous process under computer control.

18 Claims, 1 Drawing Sheet

5,354,700

METHOD OF MANUFACTURING SUPER CHANNEL TFT STRUCTURE

BACKGROUND OF THE INVENTION

1. Field of the Invention

This invention relates to FET semiconductor devices and more particularly to channel structures and methods of manufacture thereof.

2. Description of Related Art

Problems with thin film transistors include limited hole mobility $\mu_p$, insufficient transconductance, and inadequate hot carrier immunity. Silicon devices are limited by a high bandgap $E_g$ of about 1.12 eV which restricts hole mobility and transconductance.

U.S. Pat. No. 5,089,428 of Verret et al for "Method for Forming a Germanium Layer and a Heterojunction Bipolar Transistor" shows use of SiGe layers in semiconductor devices as a buffer between a P- Ge layer and an N -Si substrate. The N- $Ge_xSi_{1-x}$ layer is deposited onto the N- Si by CVD.

SUMMARY OF THE INVENTION

An object of this invention is to provide an FET device with a channel formed to provide high hole mobility $\mu_p$, high transconductance and excellent hot carrier immunity.

In accordance with this invention an FET semiconductor includes a) a substrate comprising doped silicon, with source and drain regions, b) a thin dielectric film formed on the surface of the substrate, c) a channel structure formed on the dielectric layer is a sandwich of three successive thin film layers of a first silicon layer, an $Si_{1-x}Ge_x$ layer and a second silicon layer, and d) a gate electrode Juxtaposed with the sandwich of thin film layers.

It is also preferred that the first silicon layer consists of polysilicon, and the second silicon layer also consists of polysilicon.

Preferably the first silicon layer is within the range from about 200 Å to about 1000 Å thick, the $Si_{1-x}Ge_x$ layer is within the range from about 50 Å to about 300 Å thick, and the second silicon layer is within the range from about 70 Å thick to about 500 Å thick; and preferred values are that the first silicon layer is about 70 Å thick, the $Si_{1-x}Ge_x$ layer is about 100 Å thick, and the second silicon layer about 250 Å thick.

In accordance with the method of this invention FET semiconductor is formed by the process including forming a thin dielectric film formed on the surface of a substrate comprising doped silicon, forming a channel structure on the dielectric layer by depositing a sandwich of three successive thin film layers of a first silicon layer, an $Si_{1-x}Ge_x$ layer and a second silicon layer, and forming a gate electrode Juxtaposed with the sandwich of thin film layers.

Preferably a gate electrode is formed Juxtaposed with the sandwich of thin film layers.

It is preferred that the material employed to form the first silicon layer is selected from the group consisting of polysilicon and polycide and the material employed to form the upper silicon layer is composed of polysilicon.

Preferably the first silicon layer is deposited within the range from about 70 Å to about 200 Å thick, the $Si_{1-x}Ge_x$ layer is deposited within the range from about 50 Å to about 300 Å thick, and the second silicon layer is deposited within the range from about 700 Å thick to about 1000 Å thick. It is preferred that the first silicon layer is deposited to a thickness of about 70 Å thick, the $Si_{1-x}Ge_x$ layer is about 100 Å thick, and the second silicon layer about 250 Å thick. The layers are deposited by LPCVD at a temperature of between about 350° C. and about 620° C.

Preferably, $Si_{1-x}Ge_x$ has a value of x less than about 0.5. and it is more preferable that $Si_{1-x}Ge_x$ has a value of x less than about 0.3.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Silicon has a bandgap $E_g$ bandgap of about 1.12 eV whereas germanium has a bandgap $E_g$ of about 0.7 eV. A lower bandgap is desirable to increase transconductance gain, increase hole mobility $\mu_p$, and improve hot carrier immunity. In the past the channel in silicon FET devices has been composed of silicon materials and has not included germanium.

Figure 1:
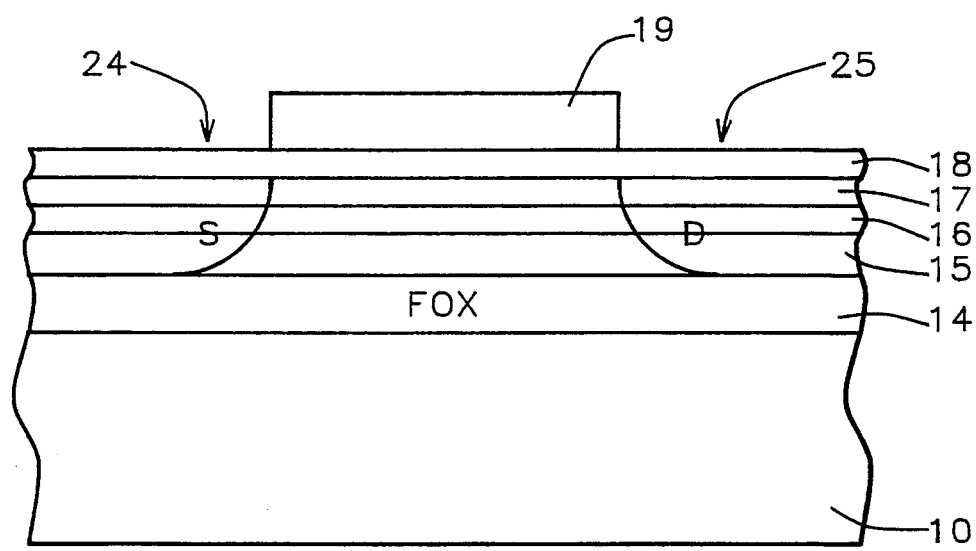
FIG. 1 shows a thin film transistor in accordance with this invention with a top gate structure.

Referring to FIG. 1, substrate 10 comprising an N or P doped silicon wafer has a thin film field oxide (FOX) film 14 formed on the surface thereof. Film 14 is formed by thermal oxidation of the silicon in the substrate 10. Formed on FOX layer 14 is a sandwich of three successive thin film layers 15, 16 and 17. The first film 15 is the lower polysilicon (or polycide) film 15, preferably between about 70 Å and about 1000 Å thick. The intermediate $Si_{1-x}Ge_x$ film 16 is preferably between about 50 Å and about 300 Å thick. The upper polysilicon film 17 is between about 70 Å and about 500 Å thick. The use of a $Si_{1-x}Ge_x$ film 16 as the carrier transfer channel avoids the interface scattering increment of the the carrier mobility. The three layer thin film structure of films 15, 16, and 17 provides what is referred to herein as a super channel TFT (thin film transistor, also referred to hereinafter as a super channel device.)

Formed on the film 17 is a gate oxide layer 18, which carries the gate 19 (preferably composed of polysilicon, but which can be composed of polysilicon, polycide or metal, e.g. aluminum). The thickness of the gate 19 is preferably between about 2000 Å and about 4000 Å thick. The gate 19 is used as a self-aligned mask for doping the source and drain regions in accordance with the usual manufacturing process, yielding the source and the drain regions as shown in areas 24 and 25 respectively.

For a defect free product the $Si_{1-x}Ge_x$ film 16 has the formula $Si_{1-x}Ge_x$ where x is less than 0.5 and preferably less than about 0.3.

The TFT can have a top gate, bottom gate or twin gate structure.

The Si/$Si_{1-x}$Ge/Si sandwich of layers 15, 16 and 17 in FIG. i is formed in one continuous process with the device in a CVD processing chamber being manufactured under computer control. After a suitable time of between about 20 minutes and about 200 minutes the system opens the valve from the Ge gas source to deposit the $Si_{1-x}$Ge layer. Still later, after an appropriate time, of between about 1 minute and about 30 minutes, the system closes the Ge gas source for continuing deposition of the upper Si layer.

EXAMPLE I

Referring to FIG. 1, layer 15 of polysilicon, layer 16 of $Si_{1-x}Ge_x$, and layer 17 of polysilicon respectively are sequentially applied. The process employed is CVD in a UHVCVD system, preferably with pure silane gas ($SiH_4$) as the source of silicon at about 420° C. at a flow rate of about 20 sccm at a pressure of about 1 mTorr, forming layer 15 preferably about 250 Å thick.

To deposit the $Si_{1-x}Ge_x$ layer 16, after about 50 to about 200 minutes, germane (Ge2H6) gas is added to the silane ($SiH_4$) gas also at about 420° C. at a flow rate of 5 sccm and a pressure of 1 mTorr. The $Si_{1-x}Ge_x$ layer 16, which is deposited preferably about 100 Å thick, should have a limited concentration of germanium because too high a concentration of germanium will induce dislocation of the lattice, so that $x<0.5$ and preferably $x<0.3$.

After about 8 minutes, the valve is tightened and finally closed at the source of germane gas Ge2H6 to remove it. The flow rate of the Ge gas source is reduced from 5 sccm to 0 sccm over a time period of 10 minutes at a pressure of 1 mTorr.

The remainder of the process deposits the upper layer 17 of polysilicon between about 70 Å to about 500 Å thick from the LPCVD silane gas ($SiH_4$) as in the case of layer 15.

Device applications for the product of Example I are SRAM PMOS, and LCD TFT's with both NMOS and PMOS.

EXAMPLE II

Again, referring to FIG. 1, layers 15–17 of polysilicon, $Si_{1-x}Ge_x$, and polysilicon respectively are applied sequentially. The process employed is LPCVD with silane gas ($SiH_4$) as the source of silicon at a temperature of about 620° C. at a flow rate of 20 sccm at a pressure of 1 mTorr. To add the $Si_{1-x}Ge_x$ layer 16, after about 50 to 200 minutes, germane (Ge2H6) gas is added to the silane ($SiH_4$) gas, at a temperature of about 600° C., at a flow rate of 5 sccm, and at a pressure of 1 mTorr. The $Si_{1-x}Ge_x$ has a concentration of germanium of 15%, so $x<0.2$. The deposition rate of SiGe is between about 5 Å/min and about 20 Å/min. After about 5 minutes to about 15 minutes, the valve is closed at the source of germane gas Ge2H6 to remove it.

The remainder of the process deposits the upper layer 17 of polysilicon from the LPCVD gas silane gas ($SiH_4$) as in the case of layer 15 at a deposition rate of about 5 Å/min.

Following the processes of Examples I and II, the gate oxide layer 18 is formed. One alternative process is to form the layer 18 by thermal oxidation of silicon layer 17 below. Therefore, the top layer 17 of the sandwich should be between about 150 Å thick and about 400 Å thick so that with the thermal oxidation $SiO_2$ layer 18 has a thickness of between about 200 Å and about 500 Å thick. The remaining portion of top polysilicon layer 17 has a thickness of between about 50 Å to about 150 Å.

The process employs deposition of polysilicon or polycide or metal which is deposited and patterned to form gate layer 19.

Then the source and drain are ion implanted in the result of the preceding step with for example boron 11 at 40 keV with a dosage between about $5\times10^{14}$ and about $5\times10^{15}$.

Figure 2:
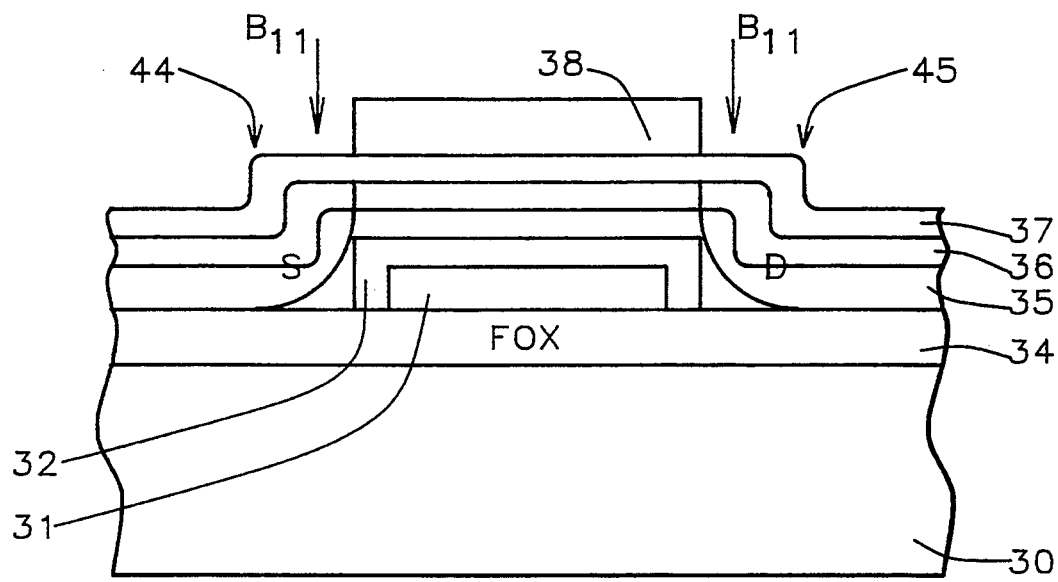
FIG. 2 shows a thin film transistor in accordance with this invention with a bottom gate structure.

Referring to FIG. 2, which shows a thin film transistor in accordance with this invention with a bottom gate structure, a substrate 30 comprising an N or P doped silicon wafer has formed on the surface thereof a thin film field oxide (FOX) film 34 formed by thermal oxidation of the silicon in the substrate 30. Formed on FOX layer 34 is the bottom gate 31 of doped polysilicon and a film 32 of gate oxide. Next follows the same sequence of three successive thin film layers 35, 36 and 37 as layers 15, 16 and 17 in FIG. 1. The first film 35 is the lower polysilicon (or polycide) film 35 preferably between about 200 Å and about 1000 Å thick. The intermediate $Si_{1-x}Ge_x$ film 36 is preferably between about 50 Å and about 300 Å thick is next. The upper polysilicon film 37 is between about 200 Å and about 500 Å thick. The use of a $Si_{1-x}Ge_x$ film 36 as the carrier transfer channel, avoids the interface scattering increment of the carrier mobility. The three layer thin film structure of films 35, 36, end 37 provides a super channel TFT (thin film transistor) with a bottom gate structure.

Formed on the film 37 is a photoresist layer 38, which provides a mask for implantation of boron (B11) for doping of the silicon in the usual manner to form the source and drain regions 44 and 45 respectively.

Ge in silicon has very low diffusivity when the temperature is less then 1100° C., so we can easily control the SiGe layer thickness with the thermal cycles of the VLSI process.

The top gate involves a self-aligned process and the bottom gate is not when implemented with a P+S/D implant. But the top gate process requires formation of the gate oxide by oxidizing the upper layer of the silicon sandwich structure channel so the final thickness of the upper layer of silicon is more difficult to control, (since the poly oxide thickness is difficult to control.)

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming an FET semiconductor device on a substrate comprising doped silicon including forming a dielectric film on the surface of said substrate,
  forming a channel structure on said dielectric film by depositing a sandwich of three successive film layers of a first silicon containing layer, a silicon-germanium layer with less germanium than silicon in said silicon-germanium layer and a second silicon containing layer, and
  forming a gate oxide and a gate electrode juxtaposed with said sandwich of three successive film layers.

2. A method in accordance with claim 1 wherein the material employed to form said first silicon layer is selected from the group consisting of polysilicon and polycide and said second silicon layer is polysilicon.

3. A method in accordance with claim 1 wherein said first silicon layer is deposited within a range from 70 Å to 200 Å thick, said $Si_{1-x}Ge_x$ layer is deposited within a range from 50 Å to 300 Å thick, and said second silicon layer is deposited within a range from 700 Å thick to 1000 Å thick.

4. A method in accordance with claim 1 wherein said first silicon layer is 70 Å thick, the silicon-germanium layer is 100 Å thick, and said second silicon layer 250 Å thick.

5. A method in accordance with claim 1 wherein said first silicon layer is 70 Å thick, the silicon-germanium layer is 100 Å thick, and said second silicon layer 250 Å thick, said sandwich of three successive film layers being deposited by LPCVD at a temperature of between 350° C. and 620° C.

6. A method in accordance with claim 1 wherein said silicon-germanium layer comprises $Si_{1-x}Ge_x$, where $0.15 \leq x < 0.5$.

7. A method in accordance with claim 1 wherein said silicon-germanium layer comprises $Si_{1-x}Ge_x$, where x is less than 0.3, said sandwich of three successive film layers being deposited by LPCVD at a temperature of between 350° C. and 620° C.

8. A method in accordance with claim 5 wherein said silicon-germanium layer comprises $Si_{1-x}Ge_x$, where wherein said $Si_{1-x}Ge_x$ has a value of x less than 0.5.

9. A method in accordance with claim 1 wherein said silicon-germanium layer comprises $Si_{1-x}Ge_x$ where $0.15 \leq x \leq 0.3$.

10. A method of forming an FET semiconductor device including a substrate comprising doped silicon with a surface forming a dielectric film on said surface of said substrate, formation on said dielectric film of a sandwich comprising a first film, an intermediate film and an upper film, said first film being a polysilicon film, said intermediate film being a silicon-germanium film with less germanium than silicon in said silicon-germanium film, and said upper film being a polysilicon film, forming a gate oxide layer structure on said upper film, forming a gate on said gate oxide, and implantation of dopant species into the source and drain regions in said device juxtaposed with said gate structure employed as a self-aligned mask.

11. A method of forming an FET semiconductor device on a substrate comprising doped silicon including forming a dielectric film on said surface of said substrate, formation of a bottom gate structure of doped polysilicon on said dielectric film, formation of a gate oxide structure on said bottom gate structure, formation on said gate oxide structure and said dielectric film of a sandwich of a first film, an intermediate film and an upper film, said first film being a silicon containing film, said intermediate film being a silicon-germanium film with less germanium than silicon in said silicon-germanium film, and upper film being a silicon containing film, formation of a mask on said upper film above said bottom gate, and implantation of dopant species using said mask for alignment to form source and drain regions beneath said mask juxtaposed with said bottom gate structure and said gate oxide structure.

12. A method of forming an FET semiconductor device on a substrate comprising doped silicon including forming a dielectric film on the surface of said substrate, forming a channel structure on said dielectric film in one continuous process using silane gas and germane gas supplied to a CVD processing chamber to deposit a sandwich of three successive film layers of a first silicon film, a $Si_{1-x}Ge_x$ film with $0.15 \leq x < 0.5$, and a second silicon film.

13. A method in accordance with claim 12 wherein said sandwich of three successive film layers is deposited in a UHVCVD system with pure silane gas ($SiH_4$) as the source of silicon at 420° C. at a flow rate of 20 sccm at a pressure of 1 mTorr, forming said first film 250 Å thick, after 50 to 200 minutes forming said $Si_{1-x}Ge_x$ film a valve is opened to add germane ($Ge_2H_6$) gas to the silane ($SiH_4$) gas also at 420° C. at a flow rate of 5 sccm and a pressure of 1 mTorr, said $Si_{1-x}Ge_x$ film being 100 Å thick; 8 minutes after opening of said germane valve, said germane valve is tightened and closed at the source of germane gas $Ge_2H_6$; the flow rate of the Ge gas source being reduced from 5 sccm to 0 sccm over a time period of 10 minutes at a pressure of 1 mTorr; said upper film comprising polysilicon having a thickness of between 70 Å to 500 Å thick deposited from LPCVD silane gas ($SiH_4$).

14. A method in accordance with claim 12 wherein said sandwich of three successive film layers is deposited in a LPCVD system with pure silane gas ($SiH_4$) as the source of silicon at 620° C. at a flow rate of 20 sccm at a pressure of 1 mTorr, forming said first film 250 Å thick, after 50 to 200 minutes forming said $Si_{1-x}Ge_x$ film a valve is opened to add germane ($Ge_2H_6$) gas to the silane ($SiH_4$) gas also at 600° C. at a flow rate of 5 sccm and a pressure of 1 mTorr, said $Si_{1-x}Ge_x$ film being 100 Å thick, with $0.15 \leq x < 0.2$ at a deposition rate between 5 Å/minute and 20 Å/minute; 8 minutes after opening of said germane valve, said germane valve is tightened and closed at the source of germane gas $Ge_2H_6$; said upper film comprising polysilicon deposited at a rate of 5 Å/minute from LPCVD silane gas ($SiH_4$).

15. A method in accordance with claim 12 wherein said first silicon layer is deposited within a range from 70 Å to 200 Å thick, said $Si_{1-x}Ge_x$ layer is deposited within a range from 50 Å to 300 Å thick, and said second silicon layer is deposited within a range from 700 Å thick to 1000 Å thick.

16. A method in accordance with claim 12 wherein said first silicon layer is 70 Å thick, the silicon-germanium layer is 100 Å thick, and said second silicon layer 250 Å thick.

17. A method in accordance with claim 12 wherein said first silicon layer is 70 Å thick, the silicon-germanium layer is 100 Å thick, and said second silicon layer 250 Å thick, said sandwich of three successive film layers being deposited by LPCVD at a temperature of between 350° C. and 620° C.

18. A method in accordance with claim 12 including the steps comprising forming a gate oxide and forming a gate electrode, said gate oxide and said gate electrode being juxtaposed with said sandwich of three successive film layers.

* * * * *